United States Patent [19]
Endo et al.

[11] Patent Number: 6,042,396
[45] Date of Patent: Mar. 28, 2000

[54] TERMINAL TREATMENT STRUCTURE OF A SHIELD WIRE

[75] Inventors: Takayoshi Endo; Kazuhisa Ishizaki; Shigemi Hashizawa; Hirotaka Fukushima; Toshiaki Hasegawa, all of Shizuoka, Japan

[73] Assignee: Yazaki Corporation, Tokyo, Japan

[21] Appl. No.: 08/943,116

[22] Filed: Oct. 3, 1997

[51] Int. Cl.[7] .................................................. H01R 4/66
[52] U.S. Cl. ........................ 439/98; 439/610; 174/65 R
[58] Field of Search .............................. 439/98, 559, 552, 439/610, 556, 97; 174/65 R, 51, 35 C

[56] References Cited

U.S. PATENT DOCUMENTS

| | | | |
|---|---|---|---|
| 4,224,464 | 9/1980 | Bunnell et al. ........................... | 174/65 |
| 5,151,053 | 9/1992 | Shinji et al. ............................. | 439/610 |
| 5,691,506 | 11/1997 | Miyazaki et al. ......................... | 174/65 |
| 5,746,625 | 5/1998 | Aparicio et al. ........................ | 439/610 |

*Primary Examiner*—Paula Bradley
*Assistant Examiner*—Alexander Gilman
*Attorney, Agent, or Firm*—Sughrue, Mion, Zinn Macpeak & Seas, PLLC

[57] ABSTRACT

A shield wire's terminal treatment structure including a housing into which a shield wire is inserted and which is secured to a mounting portion, and a shield connection ring which is capped on the housing and through which the shield wire is extended. In the structure, a braid of the shield wire which is protruded from the housing is folded over an outer peripheral surface of the housing, and the shield connection ring is mounted on the housing with the braid thus folded pushed against the outer peripheral surface of the housing.

5 Claims, 7 Drawing Sheets

TERMINAL TREATMENT STRUCTURE OF A SHIELD WIRE

BACKGROUND OF THE INVENTION

1. Field of the Invention

This invention relates to a structure of treating the terminal (end) of a shield wire (hereinafter referred to as "a shield wire's terminal treatment structure, or terminal treatment structure", when applicable) which may be connected to a variety of electrical devices such as an electric motor in an electric car for instance.

2. Description of the Related Art

In general, in the case where a current supplying wire or control signal wire is connected to an electric device mounted on a vehicle such as an electric car, it is often required to subject the wire to electro-magnetic shield treatment or water-proof treatment. The electro-magnetic shield treatment is performed to prevent the electric device from being made unstable in operation by a variety of noises. The water-proof treatment is performed to prevent the electrical contact portion or the like from being damaged by water drops or the like which may enter the electric device along the electric wire.

An example of the above-described conventional electro-magnetic shield treatment or water-proof treatment is a terminal treatment structure 100 as shown in FIG. 8.

The terminal treatment structure 100 is designed as follows: A shield electric wire 101 with a braid 104 exposed, is inserted into a water-proof grommet 115 under pressure, and then inserted in a metal casing 111 of an electrical device or the like. Inside the metal casing, a conductor 102 covered with an insulating cover 103 is extended as long as required for wiring from the end portion of the braid 104. A connecting terminal 110 such as a crimping terminal, which is to be connected to a terminal (not shown) of the electrical device, is secured to the conductor 102.

In the terminal treatment structure 100, the water-proof treatment is as follows: The water-proof grommet 115, which is made of insulating material such as synthetic rubber, is put on the shield wire 101, and the grommet 115 is press-fitted in the metal casing 111 to keep an outer cover 105 water-tight in the metal casing 111.

The electro-magnetic shield treatment is as follows: A metal shield connection ring 118, which is connected to the braid 104, is mounted on the end of the water-proof grommet 115, so that the braid 104 is electrically connected to the metal casing 111.

The shield connection ring 118 comprises: an inner cylindrical portion 119A which is inserted between the braid 104 and the insulating cover 103 covering the conductor 102 so that it is electrically connected to the braid 104; and an outer cylindrical portion 119B which covers the outer peripheral portion of the water-proof grommet 115 so that it is electrically connected to the metal casing 111. That is, the ring 118 is of a double-crown structure. Hence, the electro-magnetic shielding is achieved when the braid 104 of the shield wire 101 is electrically connected through the shield connection ring 118 to the metal casing 111.

In the above-described terminal treatment structure 100, as was described above the inner cylindrical portion 119A of the shield connection ring 118 is inserted between the insulating cover 103 and the braid 104, and the outer cylindrical portion 119B is arranged between the grommet 115 and the metal casing 111. Hence, the shield connection ring 118 acts to fix the whole terminal (end) of the shield wire 100, thus preventing the axial movement of the shield wire 100.

Hence, in the case where, in connecting the connecting terminal 110 to the connecting terminal of the electrical device, the conductor 102 covered with the insulating cover 103 is not long enough, so that it is impossible to adjust the length of the conductor 102.

Furthermore, it is impossible to provide simple locking means between the shield connection ring 118 and the water-proof grommet 115. Therefore, the shield connection ring 118 may be disengaged from the water-proof grommet 115. In this case, the electrical connection between the braid and the metal casing 111 is diminished. In order to eliminate this difficulty, in the conventional terminal treatment structure, as shown in FIG. 9, the metal casing 111 has a stepped wire inserting inlet 112. The shield connection ring 118 is abutted against the wire inserting inlet 112 so that the shield connection ring 118 may not come off the water-proof grommet 115. However, the above-described conventional structure is disadvantageous in that the metal casing 111 must be machined, and accordingly the structure is high in manufacturing cost.

SUMMARY OF THE INVENTION

In view of the foregoing, an object of the invention is to provide a shield wire's terminal treatment structure in which the amount of deflection of an end portion of a shield wire is adjustable, so that the treatment of the end of the braid can be achieved readily and positively, with the shielding effect being high in reliability.

In order to achieve the above object, the invention provides a terminal treatment structure of a shield wire comprising: a housing into which a shield wire is inserted and which is secured to a mounting portion; and a shield connection ring which is capped on the housing and through which the shield wire is extended, wherein a braid of the shield wire which is protruded from the housing is folded over an outer peripheral surface of the housing, and the shield connection ring is mounted on the housing with the braid thus folded pushed against the outer peripheral surface of the housing.

Further, the invention provides a terminal treatment structure of a shield wire comprising: a housing into which a shield wire is inserted and which is secured to a mounting portion; a metal shell which is mounted on an insulating cover of the shield wire and is partially inserted between the insulating cover and a braid of the shield wire; and a shield connection ring which is capped on the housing and through which the shield wire is extended, the shield connection ring having a first spring piece which is brought into elastic contact with an outer peripheral surface of the metal shell, and a second spring piece which is brought into elastic contact with an inner peripheral surface of the mounting portion, thus being locked to the housing.

DETAILED DESCRIPTION OF THE PREFERRED EMBODIMENTS

Figure 1:
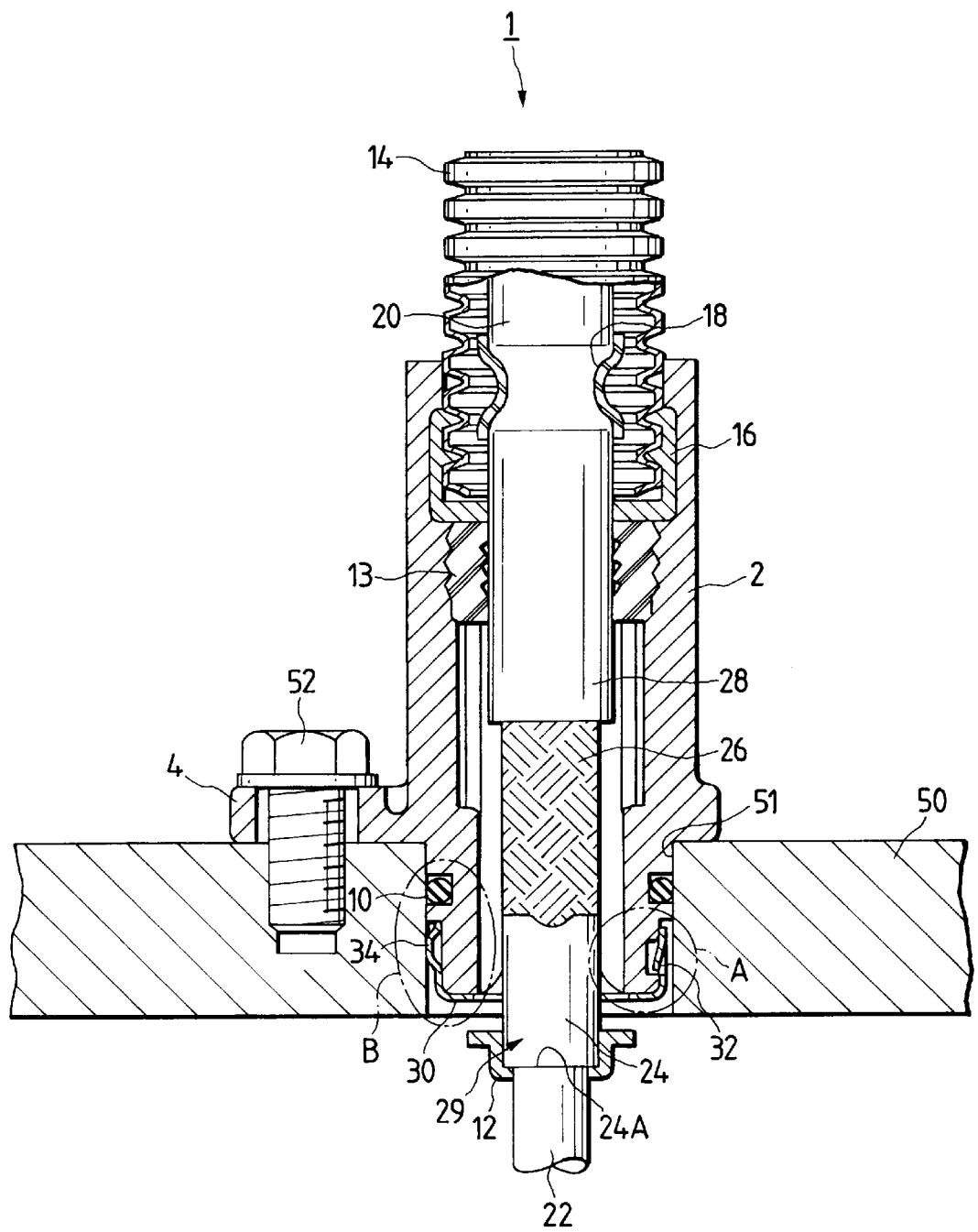
FIG. 1 is a sectional view showing an example of a shield wire's terminal treatment structure, which constitutes a first embodiment of the invention.

Preferred embodiments of the invention will be described with reference to the accompanying drawings.

First Embodiment

A shield wire's terminal treatment structure, which constitutes a first embodiment of the invention, will be described with reference to FIGS. 1 through 5.

In those figures, reference numeral 1 designates the shield wire's terminal treatment structure, the first embodiment of the invention. The terminal treatment structure 1 comprises: a housing 2 which is substantially cylindrical, and into which a shield wire 20 is inserted; and a shield connection ring 30 which is mounted on the end of the housing 2 with a braid 26 of the shield wire 20 (which has penetrated the housing 2) folded over the outer peripheral surface of the housing 2.

The housing 2 has a mounting flange 4 on the outer peripheral surface. With the mounting portion of the housing 2 fitted, for instance, in a wire inserting inlet 51 of a motor casing 50, the aforementioned flange 4 is fixed with a bolt 52. Thus, the housing 2 has been mounted on the motor casing 50.

The housing 2 has a locking groove 6 and an annular groove 8 in the outer peripheral surface thereof in such a manner that they are extended from the end portion which is fitted in the motor casing 50 towards the flange 4. The annular groove 8 is formed all around the housing 2, and a sealing member, namely, an O-ring 10 is fitted in the annular groove 8 to make the joint of the housing 2 and the motor casing 50 air-tight.

In an end portion 29 of the shield wire 20 which is fitted in the housing 2, an outer cover 28 thereof is removed to expose the braid 26, an insulating cover 24, and a conductor 22 in the stated order. The conductor 22 thus exposed is connected to a connecting terminal 55 by crimping (cf. FIG. 4) which is to be connected to a terminal of the motor (not shown).

Figure 2:
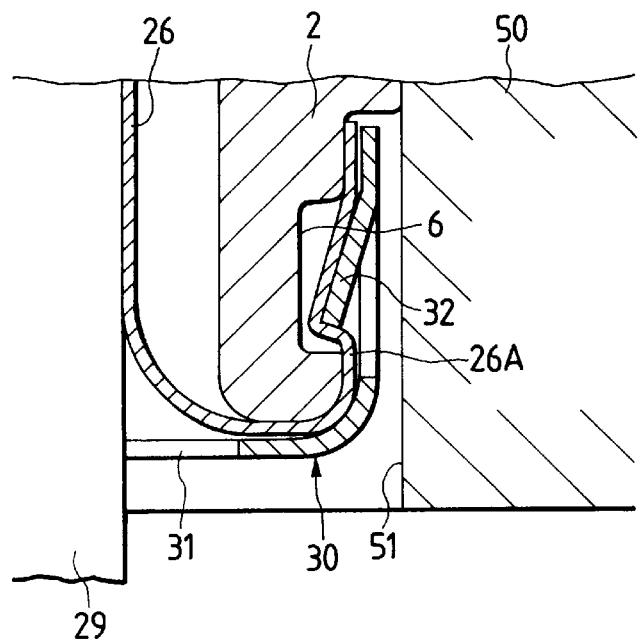
FIG. 2 is a view showing the part A in FIG. 1 in detail.
Figure 3:
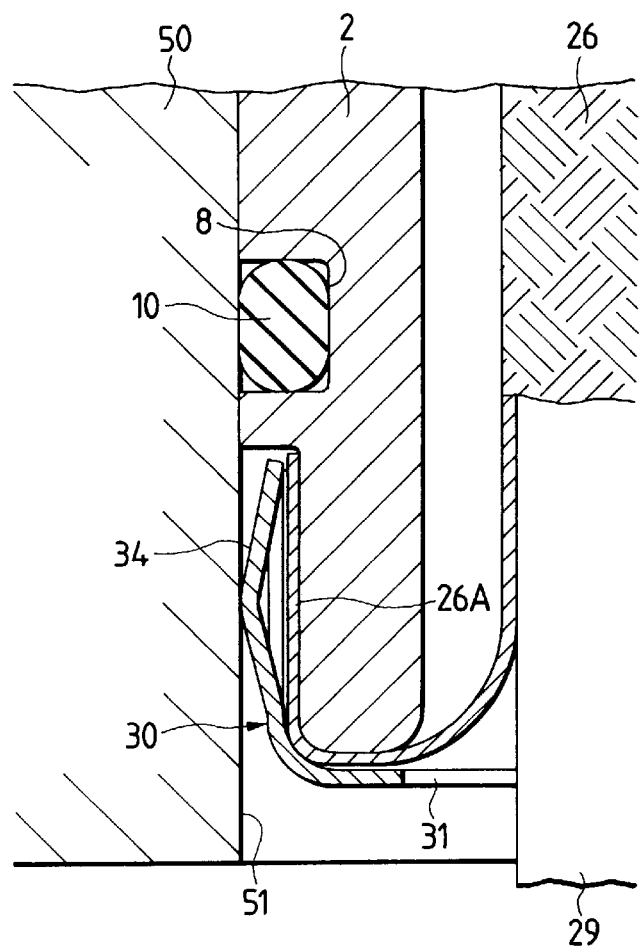
FIG. 3 is a view showing the part B in FIG. 1 in detail.

The braid 26 thus exposed is treated as follows: That is, as shown in FIGS. 2 and 3, the braid 26 is folded over the end portion of the housing 2 in such a manner that an end portion 26A protruded from the housing 2 covers the outer peripheral surface of the housing 2.

The shield connection ring 30 is formed by using a metal material which is high in elasticity. The ring 30 is in the form of a cap having a hole 31 at the center through which the shield wire is extended.

The shield connection ring 30 has a plurality of locking pieces 32 which are formed by cutting the peripheral portion thereof to form cut pieces and inwardly raising the cut pieces at a predetermined angle. Hence, the locking pieces 32 together with the end portion 26A of the braid 26 are fitted in the locking groove 6 of the housing 2.

Hence, the shield connection ring 30 is secured to the housing 2 while pushing the end portion 26A of the braid 26 against the housing. Furthermore, the shield connection ring 30 prevents the braid 26 from being shifted in position.

The shield connection ring 30 has a plurality of spring pieces 34 along the periphery thereof which are protruded outwardly as shown in FIG. 3. Those spring pieces 34 are elastically pushed against the wire inserting inlet 51 of the motor casing 50, so that the braid 26 of the shield wire 20 is grounded through the motor casing 50.

Figure 4:
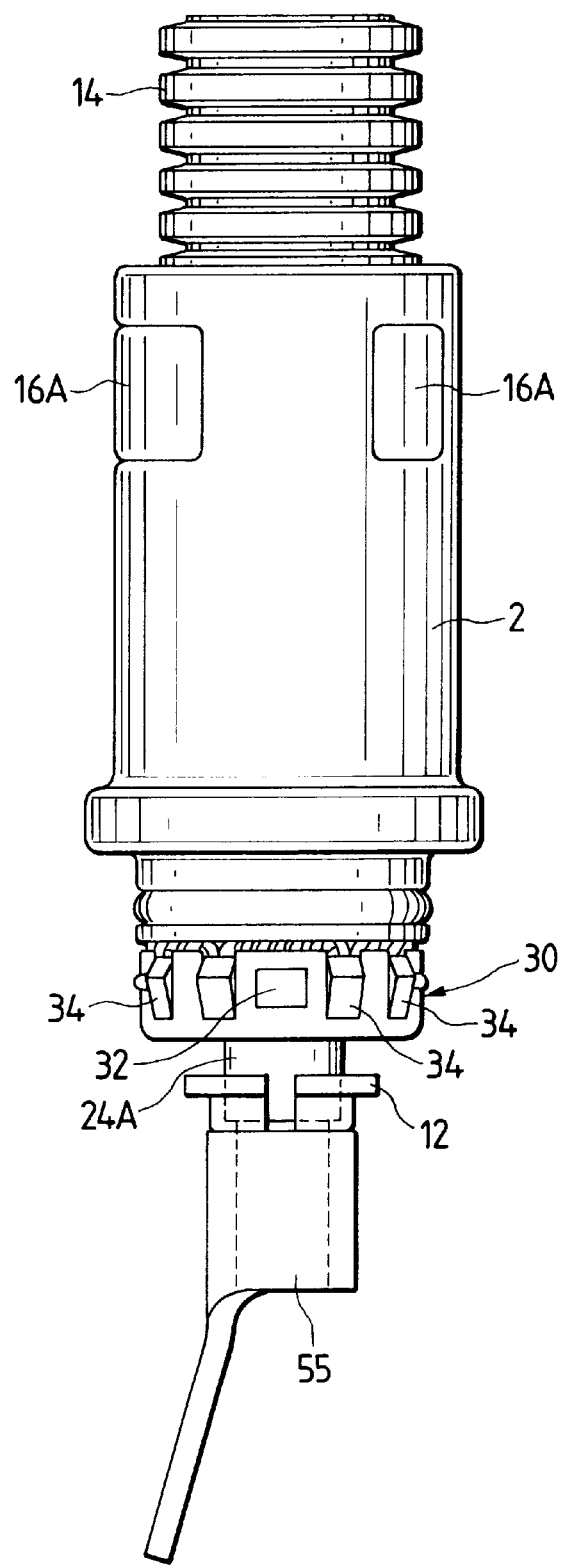
FIG. 4 is a front view of the shield wire's terminal treatment structure shown in FIG. 1.
Figure 5:
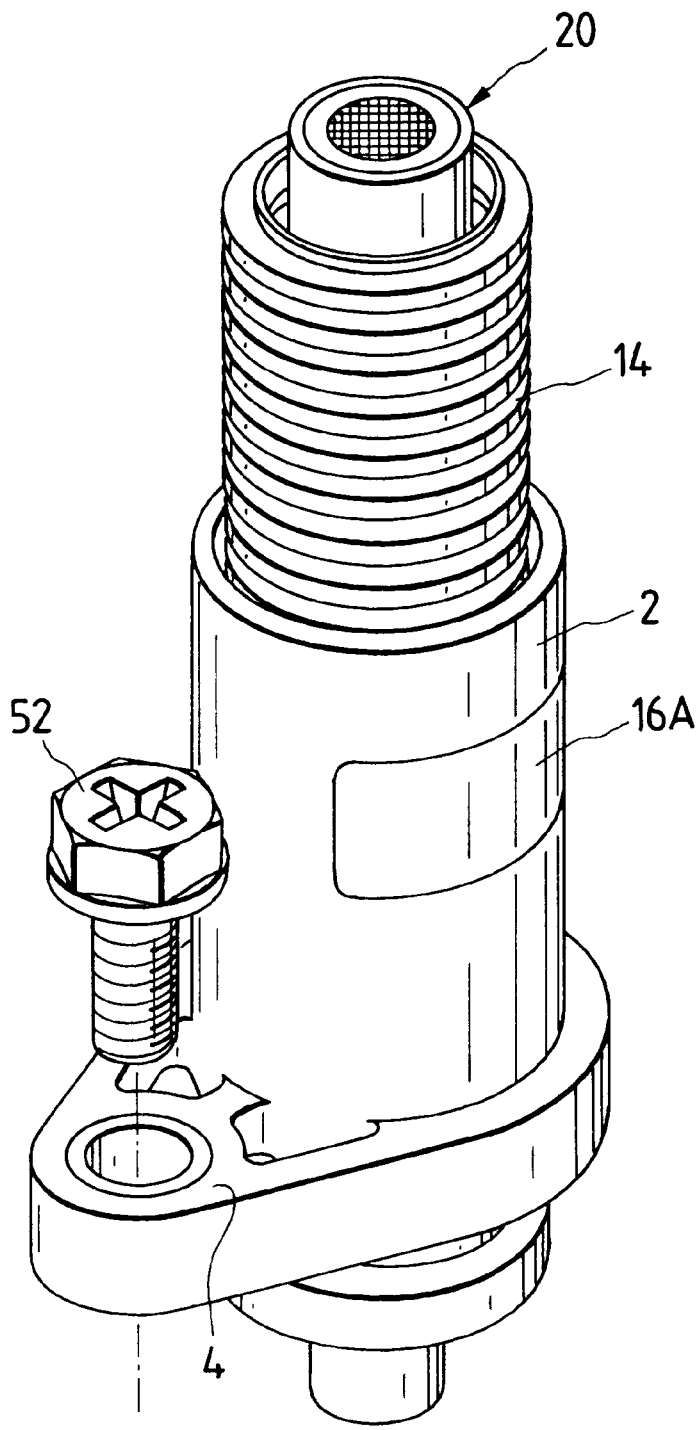
FIG. 5 is a perspective view of the shield wire's terminal treatment structure shown in FIG. 1.

An insulating ring 12 is put on the end portion 24A of the insulating cover 24 of the shield wire 20 which is protruded from the end of the housing 2. The insulating ring 12 is to prevent electrical conduction, and is made of an insulating material. The insulating ring 12 functions as follows: Even if the shield wire 20 is pulled, for instance, backwardly, so that, as shown in FIG. 4, the connecting terminal 55 approaches the shield connection ring 30, the contact of the connecting terminal 55 with the shield connection ring 30 is prevented at all times.

A water-proof plug 13 is mounted on the outer cover 28 of the shield wire 20. The plug 13 is to prevent water drops or the like from entering the housing 2 from the rear end thereof. A wire protective corrugated tube 14 is fitted in the rear end portion of the housing 2 through which the shield wire 20 is extended outwardly.

That is, the shield wire 20 penetrates the corrugated tube 14 and the housing 2.

The corrugated tube 14 is held by a holder 16 which is locked to the housing 2. The holder 16 supports the end portion of the tube in it, and has locking protrusions 16A which protrude towards the outer surface of the housing. The holder 16 abuts against the water-proof plug 13, to prevent the plug 13 from coming off.

Substantially at the rear end portion of the housing 2, a stopper ring 18 is provided pushing the outer cover 28 of the shield wire 20 which is extended through the housing 2. The stopper ring 18 is adapted to prevent the corrugated tube 14 and the shield wire 20 from shifting in position from each other.

As was described above, in the shield wire's terminal treatment structure, the braid 26 of the shield wire 20 which is protruded from the housing 2 is folded over to cover the outer peripheral surface of the housing, and the braid 26 thus folded over are covered with the shield connection ring 30 at the end of the shield wire, so that the end portion 26A of the braid 26 together with the locking pieces 32 is locked to the locking groove 6. Hence,.by controlling (increasing or decreasing) the amount of deflection of the shield wire 20 which is provided when the braid 26 are folded over the housing 2, the shield wire 20 is axially movable. For instance when the end portion 29 of the shield wire 20 is pulled towards the terminal, then the braid 26 is deformed, so that the length of the end portion 29 is adjusted. Therefore, in the case where the connecting terminal 55 is connected to the motor, the conductor which is long enough to lay the shield wire 20 can be obtained.

The shield connection ring 30 is merely put on the braid 26. Hence, the terminal treatment structure 1 can be assembled with ease, and the terminal treatment is positively achieved.

The housing 2 has the locking groove 6 in the outer peripheral surface, and the shield connection ring 30 has the locking pieces 32 which are locked to the locking groove 6. Hence, with the terminal treatment structure of the invention, unlike the conventional structure, the shield connection ring 30 can be secured to the housing 2 without provision of the stepped hole. Further, it is not necessary to machine the motor casing 50 to thereby suppress the increase of cost.

Furthermore, in the terminal treatment structure, the water-proof plug 13 and the O-ring 10 are provided between the housing 2 and the shield wire 20. Hence, the entrance of rain drops or the like into the motor casing 50 from outside can be positively prevented.

Second Embodiment

Now, another example of the shield wire's terminal treatment structure, which constitutes a second embodiment of the invention, will be described with reference to FIGS. 6 and 7, in which parts corresponding functionally to those already described with reference to the first embodiment are therefore designated by the same reference numerals or characters.

Figure 6:
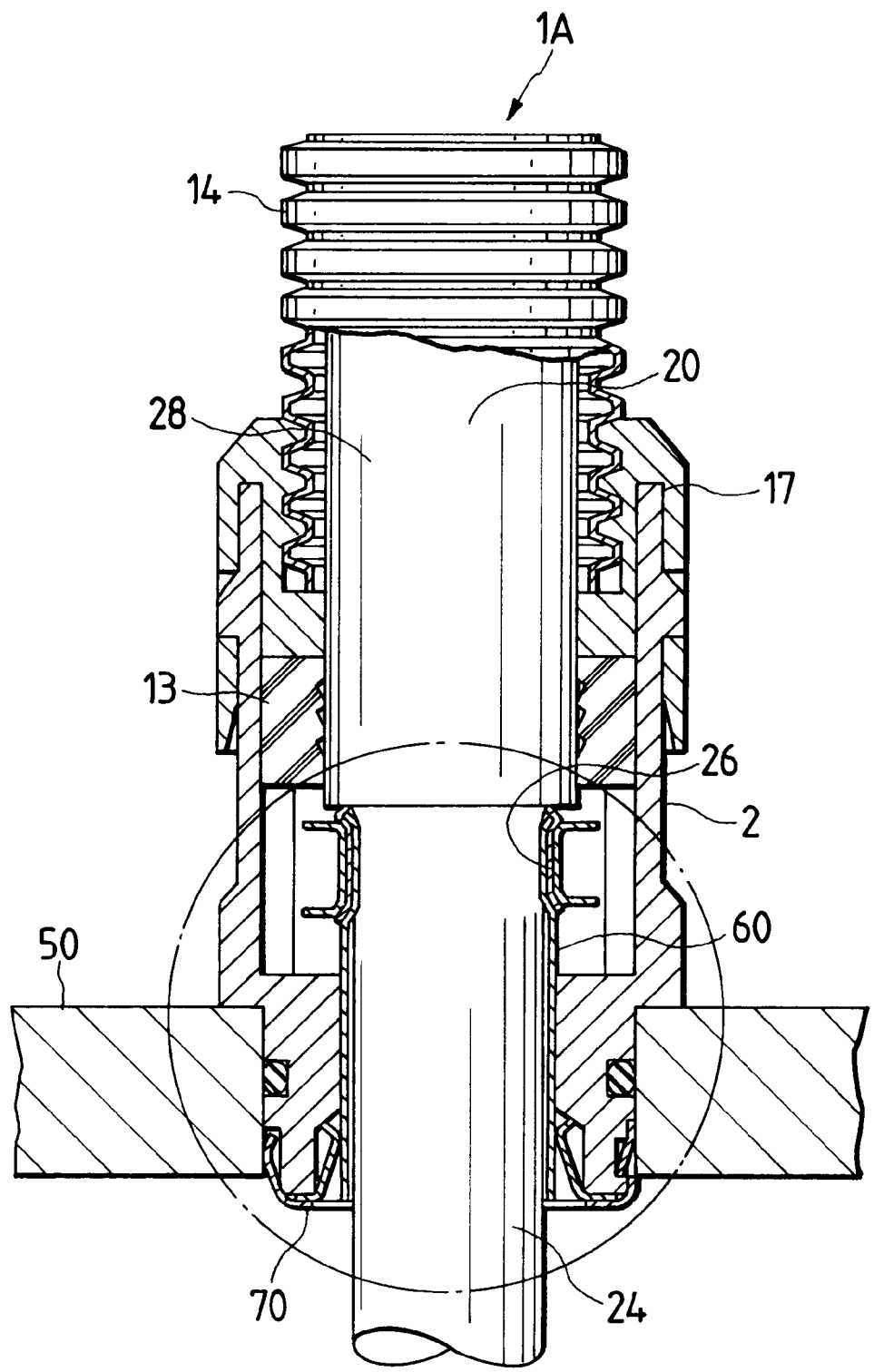
FIG. 6 is a sectional view showing another example of the shield wire's terminal treatment structure, which constitutes a second embodiment of the invention.
Figure 7:
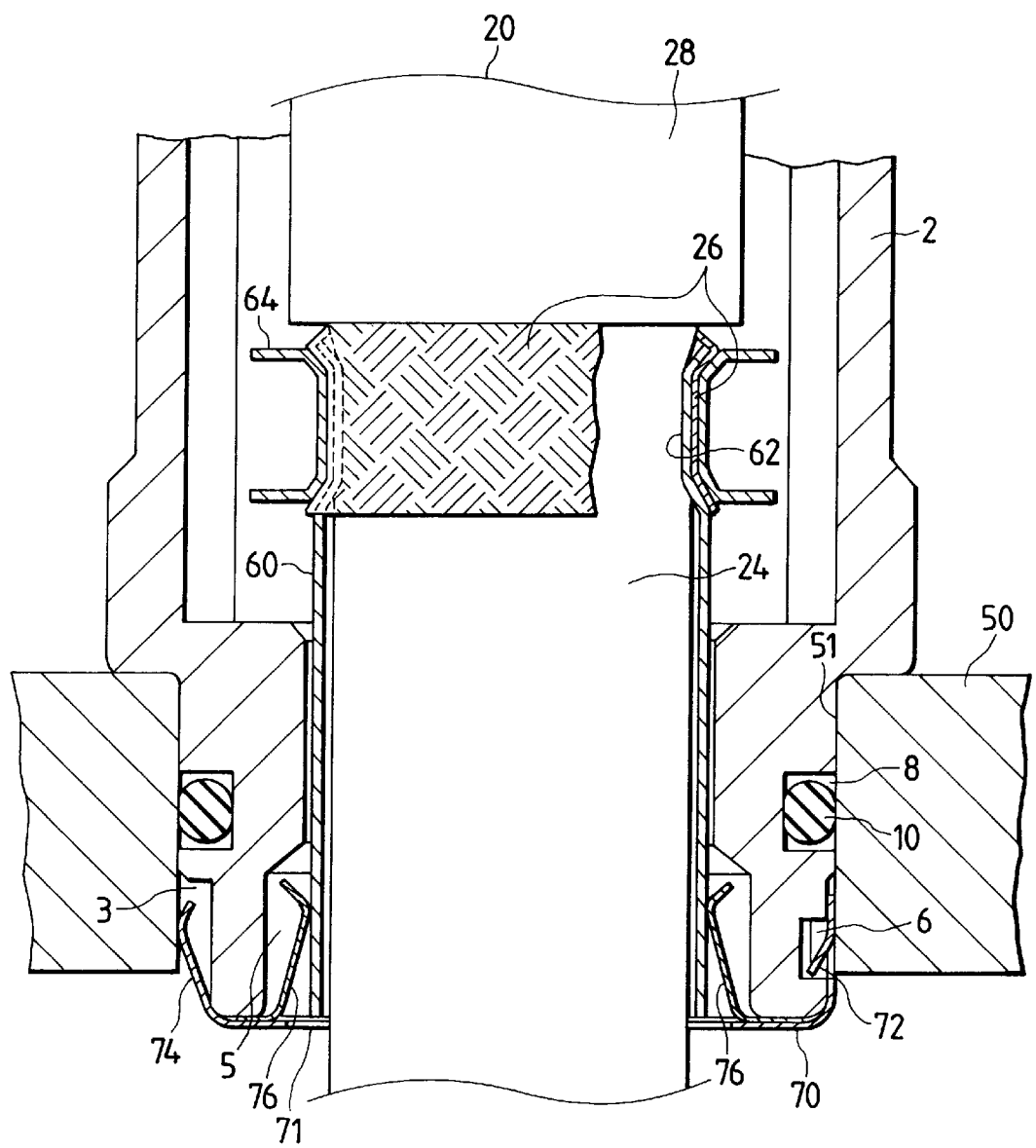
FIG. 7 is an enlarged view showing essential components of the terminal treatment structure shown in FIG. 6.
Figure 8:
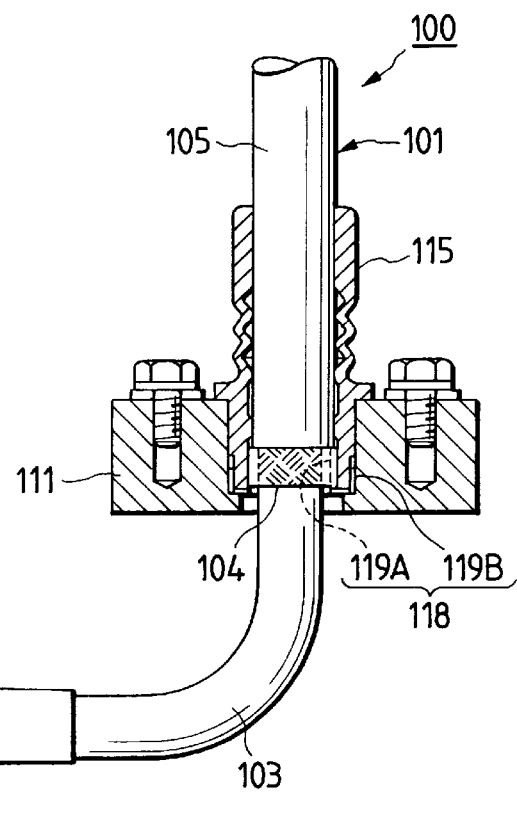
FIG. 8 is a sectional view of an example of a conventional shield wire's terminal treatment structure.
Figure 9:
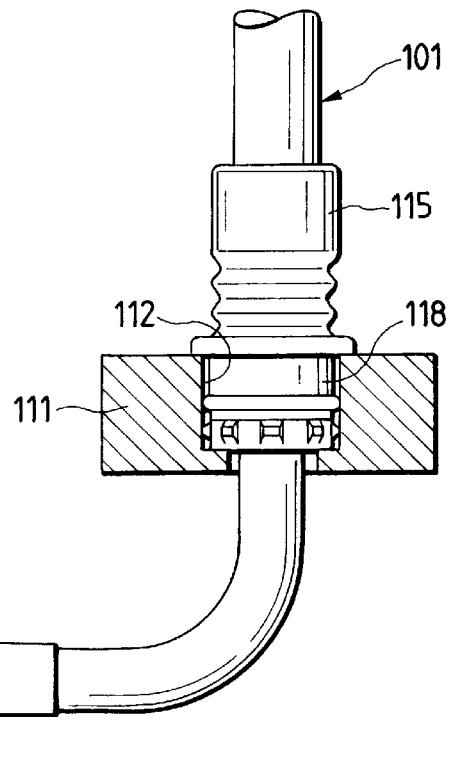
FIG. 9 is a sectional view (with parts cut away) of another example of the conventional shield wire's terminal treatment structure.

In FIGS. 6 and 7, reference character 1A designates the terminal treatment structure, the second embodiment of the invention. The terminal treatment structure 1A comprises: a substantially cylindrical housing 2 into which a shield wire 20 is inserted; a substantially cylindrical metal shell 60 which is mounted on an insulating cover 24 of the shield wire 20 inserted into the housing 2, and is partially inserted between the insulating cover 24 of the shield wire 20 and a braid 26 of the wire 20; and a shield connection ring 70 which is put on the end portion of the housing 2, and through which the shield wire 20 is extended.

The end portion of the housing 2 is fitted in a mounting portion, for instance a wire inserting inlet 51 of a motor casing 50, so that it is fixedly mounted on the motor casing 50.

The housing 2 has locking grooves 6, and an annular groove 8 in the outer peripheral surface in such a manner that those grooves 6 and 8 are arranged in the stated order in the direction of from the front end portion of the housing which is fitted in the motor casing 50 towards the rear end portion thereof. The annular groove 8 is formed fully around the housing 2, and an O-ring 10 as a sealing member is fitted in the annular groove 8 to make the joint of the housing 2 and the motor casing 50 air-tight.

More specifically, the housing 2 has a plurality of locking grooves 6 which are arranged circumferentially at predetermined intervals. The portions of the outer peripheral surface, and inner peripheral surface of the housing which correspond to the locking grooves 6 have recesses 3 and 5, respectively, which are adapted to receive spring pieces of the shield connection ring 70. That is, in the outer peripheral surface, the locking grooves 6 and the recesses 3 are formed alternately. Further, the recesses 3 in the outer peripheral surface are confronted with the recesses 5 in the inner peripheral surface, respectively.

In an end portion 29 of the shield wire 20 which is inserted into the housing 2, the outer cover 28 is removed to expose the braid 26, the insulating cover 24, and the conductor (cf. FIG. 1) in the stated order. Similarly as in the case of the above-described first embodiment, the conductor is connected to a connecting terminal which is to be connected to a motor terminal.

At the end portion 29, the metal shell 60 is mounted on the insulating cover 24 with its part inserted between the insulating cover 24 and the braid 26.

One end portion of the metal shell 60 is slightly reduced in diameter, thus providing a press portion 62. The press portion 62 presses the outer peripheral surface of the insulating cover 24 so that the metal shell 60 is prevented from being carelessly moved on the shield wire 20. The braid 26 on the press portion 62 is held with a clip 64 under pressure which is substantially equal in section to the press portion 62. The other end of the metal shell 60 is extended to the end of the housing 2.

The shield connection ring 70 is in the form of a cap, and is made of a metal material which is high in elasticity, in such a manner that it has a hole 71 at the center through which the wire and the metal shell 60 are extended. The shield connection ring 70 has a plurality of locking pieces 72 which are formed by cutting the peripheral portion thereof to form cut pieces and inwardly raising those cut pieces at a predetermined angle. Hence, the locking pieces 72 are fitted in the locking grooves 6 of the housing 2 so that the shield connection ring 70 is secured to the housing 2.

The shield connection ring 70 has a plurality of first spring pieces 74 and a plurality of second spring pieces 76 along its circular periphery. The first spring pieces 74 are protruded outwardly, while the second spring pieces 76 are protruded inwardly. Those spring pieces 74 and 76 are elastically deformably accommodated in the recesses 3 and 5, respectively. The first spring pieces 74 are elastically in contact with the wire inserting inlet 51 of the motor casing 50, while the second spring pieces 76 are elastically in contact with the outer peripheral surface of the metal shell 60. Especially, the second spring pieces 76 are slidable on the outer peripheral surface of the metal shell 60. Hence, when the shield wire 20 is axially moved or pulled, the metal shell 60, being moved together with the shield wire 20, is kept in electrical contact with the second spring pieces 76 at all times. Therefore, the braid 26 of the shield wire 20 are grounded through the metal shell 60, the shield connection ring 70, and the motor casing 50.

A wire protective corrugated tube 14, being held by a holder 17 engaged with the housing 2, is engaged with the rear end portion of the housing 2. A water-proof plug 13 is held between the housing 2 and the outer cover 28.

As is apparent from the above description, in the shield wire's terminal treatment structure, the shield connection ring 70 acts to bring the first spring pieces 74 into elastic contact with the motor casing 50 and also to bring the second spring pieces 76 into contact with the metal shell 60 through the braid 26 at all times. Hence, even when the wire is pulled towards the terminal, the conduction of the braid 26 and the motor casing 50 is maintained unchanged. Thus, the shielding is high in reliability.

In the case where the metal shell is employed, in general, the metal shell is made integral with the housing by insert molding. However, in the embodiment of the invention, the metal shell is mounted on the insulating cover; that is, it is separate from the housing. Hence, the formation of the housing is not intricate; that is, the housing can be formed with ease.

As was described above, in the shield wire's terminal treatment structure of the invention, the braid of the shield wire protruded from the housing is folded over the housing, and the shield connection ring is capped on the braid thus folded. Hence, with the braid only locked to the housing, the shield wire can be axially moved. Therefore, as the shield wire is laid over the vehicle body, the length of the end portion of the shield wire can be adjusted, so that the connecting terminal can be connected to the mating terminal with ease. Furthermore, since the shield connection ring is merely capped on the braid, the terminal treatment structure can be assembled with ease.

Alternatively, the locking grooves are formed in the outer peripheral surface of the housing, and the shield connecting ring has the locking pieces which are engageable with the locking grooves. Hence, in the terminal treatment structure of the invention, unlike the conventional structure, the shield connection ring can be secured to the housing without formation of the stepped hole in the motor casing. Hence, the motor casing can be simplified in configuration, which results in a reduction in manufacturing cost as much.

On the other hand, the water-proof plug and the O-ring are provided between the housing and the shield wire. This feature positively prevents the entrance of water into the motor casing.

Furthermore, in the terminal treatment structure of the invention which comprises the metal shell, and the shield connection ring which is slidably in elastic contact with the metal shell, and is connected to the motor casing, the shield wire is movable, and the shielding is high in reliability.

Moreover, the metal shell is provided separate from the housing. This feature eliminates the difficulty that the housing is unsatisfactory in configuration.

What is claimed is:

1. A terminal treatment structure of a shield wire comprising:

a housing into which a shield wire is inserted and which is secured to a mounting portion, said housing having an outer peripheral surface, said outer peripheral surface of said housing having a locking groove; and a shield connection ring which is capped on said housing and through which the shield wire is extended, wherein a braid of the shield wire which is protruded from said housing is folded over said outer peripheral surface of said housing, said shield connection ring being mounted on said housing with the braid thus folded pushed against the outer peripheral surface of said housing, said shield connection ring having a locking piece which is engagable with said locking groove.

2. The terminal treatment structure as claimed in claim 1, wherein a conduction preventing insulating ring which is adapted to prevent a contact of said shield connection ring with a connecting terminal connected to a conductor of the shield wire, is put on an end portion of an insulating cover of the shield wire which is protruded from said housing.

3. The terminal treatment structure as claimed in claim 1, wherein an annular sealing member is provided between the outer peripheral surface of said housing and said mounting portion.

4. The terminal treatment structure as claimed in claim 1, wherein a water-proof plug is provided between an outer cover of the shield wire and said housing.

5. A terminal treatment structure of a shield wire comprising:

a housing into which a shield wire is inserted and which is secured to a mounting portion;

a metal shell which is mounted on an insulating cover of the shield wire and is partially inserted between the insulating cover and a braid of the shield wire; and a shield connection ring which is capped on said housing and through which the shield wire is extended, said shield connection ring having a first spring piece which is brought into elastic contact with an outer peripheral surface of said metal shell, and a second spring piece which is brought into elastic contact with an inner peripheral surface of said mounting portion, thus being locked to said housing.

* * * * *